United States Patent [19]

Kravetsky et al.

[11] Patent Number: 4,915,773
[45] Date of Patent: Apr. 10, 1990

[54] PROCESS FOR GROWING SHAPED SINGLE CRYSTALS

[76] Inventors: Dmitry Y. Kravetsky, ulitsa Bibliotechnaya, 13, kv. 91; Lev M. Zatulovsky, Orlikov pereulok, 8, kv. 55; Leonid P. Egorov, ulitsa Profsojuznaya, 75, korpus 1, kv. 92; Boris B. Pelts, ulitsa Lesnaya, 63/43, kv. 157; Leonid S. Okun, ulitsa Udaltsova, 4, kv. 306; Viktor V. Averyanov, ulitsa Energeticheskaya, 10, korpus 2, kv. 95; Efim A. Freiman, ulitsa 2-aya Vladimirskaya, 15, korpus 1, kv. 53; Alexandr L. Alishoev, Kronshtadtsky bulvar, 13, korpus 2, kv. 168, all of Moscow, U.S.S.R.

[21] Appl. No.: 241,988

[22] PCT Filed: Oct. 23, 1987

[86] PCT No.: PCT/SU87/00117
§ 371 Date: Jul. 26, 1988
§ 102(e) Date: Jul. 26, 1988

[87] PCT Pub. No.: WO88/03967
PCT Pub. Date: Jun. 2, 1988

[30] Foreign Application Priority Data

Nov. 26, 1986 [SU] U.S.S.R. ............................ 4149059

[51] Int. Cl.[4] ............................................. C30B 15/14

[52] U.S. Cl. .............................. 156/617.1; 156/601; 156/608; 156/620.1; 156/620.5; 156/DIG. 61; 156/DIG. 89

[58] Field of Search ............... 156/601, 608, 617.1, 156/620.1, 620.5, DIG. 61, DIG. 89; 422/249

[56] References Cited

U.S. PATENT DOCUMENTS

| | | | |
|---|---|---|---|
| 3,715,194 | 2/1973 | Plooster | 423/625 |
| 3,853,489 | 12/1974 | Bailey | 156/DIG. 88 |
| 3,870,477 | 3/1975 | Labelle | 156/608 |
| 3,915,656 | 10/1975 | Mlavsky et al. | 422/249 |
| 3,953,174 | 4/1976 | Labelle | 422/249 |
| 3,961,905 | 6/1976 | Rice | 156/DIG. 61 |

Primary Examiner—John Doll
Assistant Examiner—Robert M. Kunemund
Attorney, Agent, or Firm—Burgess, Ryan and Wayne

[57] ABSTRACT

A process for growing shaped single crystals of refractory optically transparent metal compounds comprising melting a starting stock in an inert gas atmosphere under the effect of heat evolved by a heater; the melt is continuously fed into a crystallization zone through a capillary system of a shaping unit, followed by pulling a single crystal from the crystallization zone and cooling thereof. Prior to melting of the starting stock one control particle thereof is placed into the crystallization zone and at the moment of melting of said particle the heater power P is recorded. Melting of the starting stock is conducted at a heater power of (1.04–1.1)P, fusing of the seed—at a power of (1.03–1.08)P, building-up of the single crystal—at a power of (1.02–1.08)P; pulling—at a power of (1.02–1.22)P.

5 Claims, 1 Drawing Sheet

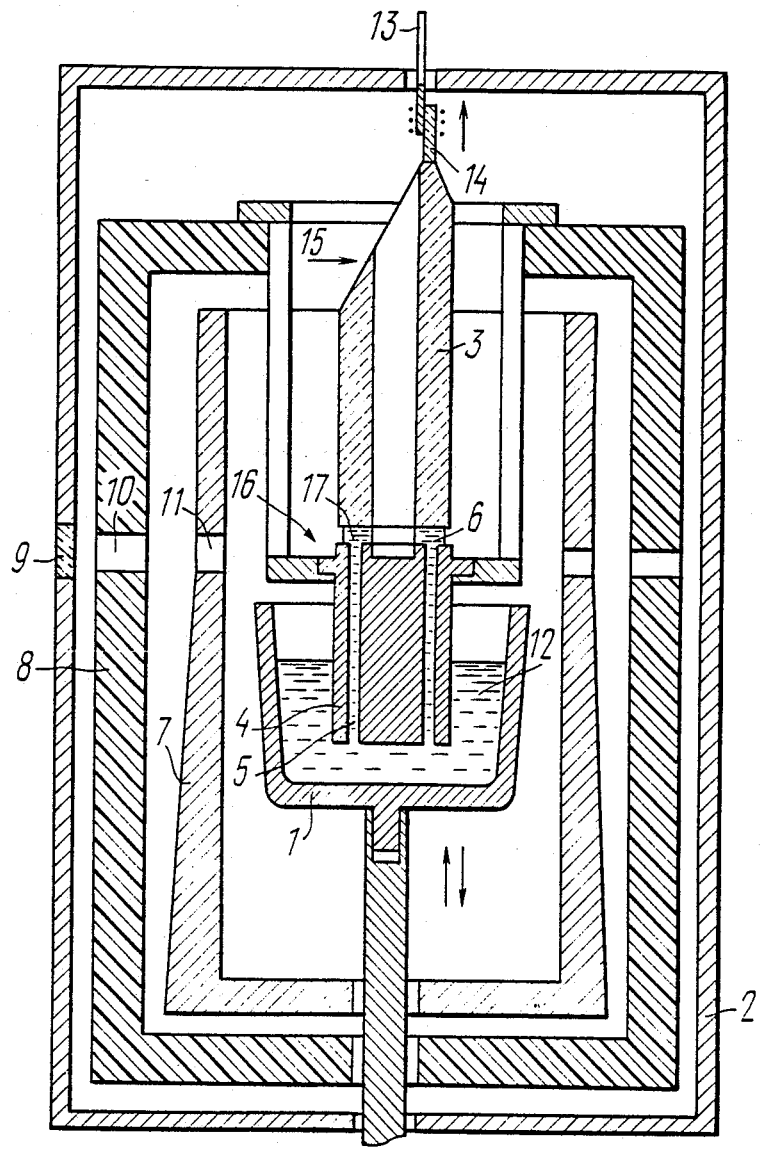

PROCESS FOR GROWING SHAPED SINGLE CRYSTALS

FIELD OF THE ART

The present invention relates to growing crystals from melts and, more specifically, to a process for growing single crystals of refractory optically transparent metal compounds, more particularly, to a process for growing shaped single crystals.

PRIOR ART

The quality of shaped single crystals, namely the accuracy of dimensions, electric-breakdown resistance, value of integral light transmission, crystallographic disorientation of single-crystal blocks and mechanical strength, depends on the temperature conditions in the zone of crystallization and pulling of the single crystal, as well as on the conditions of cooling of the grown single crystal. Therefore, the main factor defining the quality of crystals is the character of the temperature field in the "melt-single crystal" system. Melting of the starting materials should be effected under a minimum possible overheating, causing no spontaneous crystallization of the melt. This diminishes its dissociation and interaction with the material of the crucible, which result in an increase of foreign inclusions and microblisters in the single crystal, that impair the light transmission and electric breakdown resistance of single crystals.

The temperature field in the zone of crystallization of the single crystal should be of such a character that would ensure the obtaining of a shaped single crystal with the predetermined accuracy of geometrical dimensions; for example, it should be uniform over the single crystal cross-section.

The conditions of cooling of the single crystal should provide minimum temperature stresses therein and preclude the formation of cracks.

Growing of shaped single crystals of refractory optically transparent metal compounds is a complicated multi-staged process. The manner of carrying out each step of this process considerably influences the yield of suitable crystals and service life of the process equipment, which are among the main factors defining their production costs.

The most important criterion of the process for growing single crystals is the yield of the final product, which is inferred from the compliance of the criteria of the crystal quality with the required values. For example, for shaped single crystals of sapphire in the form of tubes employed in high-pressure sodium lamps, the yield of acceptable single crystals is determined by the geometry of tubes (deviation of the inside diameter of a tube is ±0.2 mm), electric breakdown resistance (not less than 50 kV/mm), value of integral light transmission (at least 92%), crystallographic disorientation of blocks in a tube (mechanical strength and service life of tubes become sharply reduced at a disorientation of more than 20°). In some cases the number of blocks in a tube is also rated.

Known in the art is a process for growing shaped single crystals of refractory optically transparent metal compounds (DE, B, 2325104) comprising melting, in an inert gas atmosphere, a starting material of a respective refractory metal compound by heat evolved by a heater, fusing of a seed in the crystallization zone, building-up of a single crystal and pulling thereof from the crystallization zone to the required length under a continuous supply of the melt to the crystallization zone through a capillary zone of a shaping unit and variation of the heater power, whereafter the single crystal is cut-off from the melt and cooled.

To maintain the required accuracy of the geometrical dimensions of a shaped single crystal, in pulling use is made of an optical control of the height of the melt column between the end face of the shaping unit and the crystallization front, the constant height of the column being adjusted by varying the heating unit power. In so doing, the melt overheating in the crucible may occur, which impairs the physical properties of the single crystal.

It should also be noted that after cutting-off the single crystal from the melt the heater is immediately switched off and the crystal cooling proceeds as a natural process, thus resulting in a thermal shock at the end portion of the single crystal and cracking in this zone. All this lowers the yield of acceptable crystals.

Also known in the art is a process for growing shape single crystals (P.I. Antonov et al., "Poluchenie profilirovannych monokristallov i izdelii sposobom Stepanova", 1981, Nauka (Leningrad), pp. 137-142), comprising melting of a starting stock of a corresponding refractory metal compound in an inert gas atmosphere under the effect of heat evolved by a heater, fusing of a seed in the crystallization zone, building-up of a single crystal, pulling thereof from the crystallization zone to a required length under continuous supply of the melt into the crystallization zone through a capillary system of a shaping unit and through variation of the heater power, after which the single crystal is cut-off from the melt and cooled.

In this process for growing shaped single crystals of refractory optically transparent compounds of metals the overheating of the melt in the crucible is about 40° C. However, at melting temperatures of refractory optically transparent compounds of metals nearing 2,000° C., an overheating amounting even to several degrees enhances the physico-chemical interactions in the "melt-single crystal" system providing an essential detrimental effect on physical properties of single crystals.

Furthermore, in growing single crystals of different profiles various shaping units are employed. During the process of growing shaped single crystals non-controllable changes occur in the actual conditions of growing single crystals, affecting the temperature field distribution in the "melt-single crystal" system.

In this process cooling of the single crystal after its cutting-off from the melt is also non-controllable, which results in cracking of the single crystal.

DISCLOSURE OF THE INVENTION

The present invention is directed to a process for growing shaped single crystals of optically transparent refractory compounds of metals under such thermal conditions which would ensure an optimal character of the heat field in the system of "melt-single crystal" thus improving quality of the single crystals.

This problem is solved by that in a process for growing shaped single crystals of refractory optically transparent compounds of metals, which comprises melting a starting stock of a corresponding refractory metal compound in an inert gas atmosphere under the effect of heat evolved by a heating unit, fusing of a seed in the crystallization zone, building-up a single crystal and pulling thereof from the crystallization zone to an appropriate length while continuously supplying the melt into the crystallization zone through a capillary system of a shaping unit and varying the heating unit power, whereafter the single crystal is cut-off from the melt and cooled, in accordance with the present invention, prior to melting of the starting stock one control particle of the starting stock is placed into the crystallization zone, the heating unit power P is recorded at the moment of melting of the control particle and melting of the starting stock is effected at a power of the heating unit of $/1.04–1.1/P$, fusing of the seed—at $/1.03–1.08/P$, building-up of the single crystal—at $/1.02–1.22/P$ and cooling of the single crystal is effected at a rate of 20°–30° C./min by decreasing the power of the heating unit and when the heating unit temperature reaches 1,600°–1,550° C. the heating unit is switched-off.

In the process for growing shaped single crystals of refractory optically transparent compounds of metals the use of a control particle of the starting feedstock makes it possible to set the heating unit power with a high accuracy upon its melting and to ensure sufficiently narrow temperature ranges of growing the single crystal.

This enables melting of the starting stock and carrying out the process of pulling the single crystal at a minimal overheating of the melt of not more than 30° C., accurate defining of the optimal temperature ranges of melting the seed, building-up of the single crystal, growing thereof with due account of the actual conditions, thus substantially improving the quality of the grown single crystals and increasing the yield of final single crystals by 35–40%.

BRIEF DESCRIPTION OF DRAWINGS

The present invention is further illustrated by the description of a particular embodiment thereof with reference to the accompanying drawing, which shows a schematic general view of an apparatus for growing shaped single crystals of refractory optically transparent compounds of metals (in elevation) at the stage of completion of growing single crystals.

DETAILED DESCRIPTION OF THE INVENTION

The process for growing shaped single crystals of refractory optically transparent compounds of metals according to the present invention resides in the following.

Into a crucible 1 placed in a sealed chamber 2 and being in its lowermost position (not shown) the starting stock of a respective refractory optically transparent metal compound for the production of a single crystal 3 is charged. The cross-section (profiles) of the grown single crystals, depending in the shaping unit employed with its upper end face having a shape repeating the shape of the cross-section of the single crystal, can be most different: tubes of a round, triangular and rectangular section, tubes with transverse partitions, rods of various cross-sections (including those with inner longitudinal channels), caps, crucibles, debietueses, pipes and bars with helical surfaces. The shaping unit 4 in the embodiment of the present invention shown in the accompanying drawing has a capillary system for the supply of a melt from the crucible to its upper end face made as an annular capillary 5. In the illustrated embodiment the upper end face 6 of the shaping unit 4 has an annular shape. The process according to the present invention makes it possible to grow shaped single crystals of various refractory optically transparent compounds of metals: leucosapphire having the melting point of 2,053° C., ruby (M.p. 2,075° C.), scandium oxide (M.p. 2,485° C.), alumoyttrium garnet (M.p. 1,950° C.).

The starting stock of a respective refractory compound of a metal in the form of lumps of arbitrary shape and a volume of from 1 to 5 cm$^3$ are charged into the crucible 1.

Then a control particle, (not shown) of arbitrary shape, of the starting stock is placed onto the end face 6 of the shaping unit.

The dimensions of the control particle of the starting stock should be such that its maximum linear size be 2–3 times greater than the width (or diameter) of the capillary 5 of the capillary system of the shaping unit 4.

After sealing the chamber 2 and setting it under vacuum annealing is effected, whereupon voltage is applied to a heater 7 located in a heat-insulated casing 8 and, under the effect of heat evolved by the heater 7, the crucible 1 with the shaping unit 4 is heated to an annealing temperature of from 1,300° to 1,500° C., kept at this temperature for 20 to 30 minutes to ensure outgassing of the apparatus members. Then the chamber 2 is filled with an inert gas such as argon under a pressure of from $9.81 \times 10^4$ to $10.79 \times 10^4$ Pa.

Thereafter, depending on the melting point of the particular refractory compound employed for growing the single crystal 3, the heating temperature is elevated to a temperature 40°–50° C. lower than the melting point of the compound by increasing the power of the heating unit 7 to the value of $P_o$. The heating temperature is controlled, for example, by means of a pyrometer.

A further increase of the power of the heater 7 is effected stepwise till the control particle of the starting stock gets molten: the power of the heater 7 is increased by 0.50–1.0% of Po with residence of 5 to 8 minutes after each increase.

The moment of melting of the control particle is noted and the power p of the heater 7 at this moment is recorded. The state of the control particle is monitored visually through windows 9, 10, 11 provided in the chamber 2, heat-insulating casing 8 and heater 7 respectively at the level of the end face 6 of the shaping unit 4.

Melting of the starting stock is effected at a power of the heater 7 equal to (1.04–1.1)P. At a power of the heater 7 equal to less than 1.04P a complete melting of the starting stock is not guaranteed, the melting duration is considerably extended, and consumption of electric power is increased. If power of the heater 7 exceeds 1.10P, the melt 12 gets overheated, its dissociation is intensified along with its interaction with the material of the crucible 1 and the atmosphere of the chamber 2. As a result, the growing single crystal 3 gets contaminated and the number of gas inclusions in its bulk is increased which, in turn, results in decreased light transmission, electricbreakdown strength and mechanical strength of the single crystal. Due to higher electric power inputs, the production costs of the single crystal 3 are also increased.

After melting of the starting stock the crucible 1 is lifted into its uppermost position shown in the attached drawing first to ensure contact of the melt 12 with the capillary system of the shaping unit 4 and then into the working position in which the distance from the surface of the melt 12 in the crucible 1 to the end face 6 of the shaping unit 4 is approximately 20 mm.

Thereafter, a rod 13 with a seed 14 is descended till its contact with the end face 6 of the shaping unit 4 and the seed 14 is fused at a power of the heater 7 equal to (1.03–1.08)P. In so doing, between the seed 14 and the end face 6 of the shaping unit 4 a column (not shown) of a melt of a refractory optically transparent compound of a metal is formed. According to the shape of this column visualized through the windows 9, 10 and 11 the power of the heater 7 required for fusing the seed 14 is established. The diameter of the melt column should be equal to 0.7–0.8 of the diameter of the seed 14. If this diameter is within the permissible range, the heater power upon melting of the seed 14 is not changed.

If the column diameter exceeds the permissible value, the power of the heater 7 is increased, and vice versa.

At a power of the heater 7 less than 1.03P no required adherence of the seed 14 to the melt column formed at the end face of the shaping unit 4 is ensured. For this reason, at the seeding site a considerable number of crystallographic blocks originate which are inherited by the growing single crystal 3, wherefore the mechanical strength and electric breakdown strength of the single crystal 3 get impaired. Even extreme situations are possible, where the melt from the column simply adheres to the seed 14 and in this case the crystallographic orientation of the seed 14 is not imparted to the growing single crystal 3 and a sample with a polycrystalline structure is obtained. If the power of the heater 7 exceeds 1.08P, the seed 14 is fused excessively, the melt column is broken, and it becomes necessary to perform reseeding at a lower power of the heater 7.

Building-up of the single crystal 3 to a constant predetermined cross-section area is effected at a speed of travel of the seed 14 ranging from 0.5 to 1 mm/min. During the building-up stage the power of the heater 7 is equal to (1.02–1.08)P. The region 15 of building-up of the single crystal 3 having a conical shape with an angle at the apex of from 40° to 50° is visualized through the windows 9, 10 and 11. To keep the angle value within the above-mentioned limits, the power of the heater 7 is varied accordingly.

If the upper limit of the power of the heater 7 is more than 1.08P, the building-up process becomes rather long. The building-up region 15 unsuitable for use has a considerable length in the single crystal obtained, thus adding to the production costs of single crystals. If the lower limit of the power of the heater 7 is less than 1.02P, a great number of blocks with disorientation of 30° and more originate therein due to a rapid building-up of the single crystal 3, wherefore the mechanical strength of single crystals 3 gets substantially lowered down to the crystal cracking upon growing in the chamber 2 under the effect of thermoelastic stresses occurring within its volume. After the building-up stage in the zone 16 of crystallization over the end face 6 of the shaping unit 4 an annular column 17 of a melt of a refractory optically transparent compound of a metal is formed.

Upon pulling of the single crystal 3 from the zone 16 of crystallization the power of the heater 7 is maintained within the range of (1.02–1.22)P preferably increasing it towards the upper limit thereof to ensure predetermined dimensions of the cross-section of the single crystal 3 with the required margins. The pulling speed is 1 to 5 mm/min. If the power of the heater 7 is above 1.22P, the pulling is effected at a height of the column 17 of the melt exceeding the rated value varied within the range of from 0.2 to 0.3 mm. In this case the area of the cross-section of the obtained single crystal 3 is less than the required one; faceting of the lateral surface of the single crystal 3 appearing at a high column 17 of the melt even further impairs the geometry of its cross section. As a result, the yield of single crystals suitable as to the size of their cross section is reduced. If the power of the heater 7 is below 1.02P, the height of the column 17 of the melt 10 is less than the rated value and the growing single crystal 3 can even freeze onto the shaping unit 4. In this case the process must be stopped. At best, various surface defects appear in the single crystal 3, which give rise to the origination of a block structure; this lowers the yield of suitable single crystals.

After growing the single crystal 3 to the appropriate length, it is cut-off from the melt, for example, by bringing the crucible 1 down, and the single crystal is cooled to a temperature of 1,550° to 1,600° C. at a rate of 20°–30° C./min by way of decreasing the power of the heater 7.

The length of a grown single crystal 3 can be up to 1,000 mm and over; it depends on the design and size of the apparatus employed for growing shaped single crystals.

If upon cooling of the single crystal 3 the rate of temperature lowering is above 30° C./min or the lower limit of temperature decrease is above 1,600° C., cracking may occur, as experience shows, at the end of the single crystal 3 owing to a considerable value of thermoelastic stresses. In this region of the single crystal 3 cracks and chips may appear as well. The yield of suitable single crystals is thereby reduced. The service life of such single crystals is also shortened. Cooling of single crystals 3 to a temperature below 1,550° C. or at a rate of less than 10° C./min is not advisable since in this case the process duration is extended without, however, any improvement in the single crystal quality.

After lowering the temperature to 1,550° C. the heater 7 is switched-off and a further cooling of the single crystal 7 is effected in a natural way to the ambient temperature.

For a better understanding of the present invention some specific examples are given hereinbelow by way of illustration.

EXAMPLE 1

A lot of leucosapphire single crystals is produced in the number of 10 shaped as tubes with the outside diameter of 8.7 mm, inside diameter of 7.0 mm and 800 mm length. Into a molybdenum crucible the starting stock of leucosapphire is charged: lumps of alumina of a high purity grade (99.9%). To produce tubes, a shaping unit from molybdenum is used, having the outside diameter of its upper end face onto which a control particle of the starting stock is placed equal to 8.8 mm, the inside diameter of 6.95 mm and height of 50 mm. The average diameter of the annular capillary is 7.9 mm, width—0.3 mm. Onto the end face of the shaping unit a control particle of the starting stock with the size of $0.5 \times 0.8 \times 0.8$ mm$^3$ is placed. The seed has the shape of a rod with the length of 30 mm and cross-section area of 4 mm$^2$.

Then the chamber is sealed, air is evacuated to the pressure of $7 \times 10^{-3}$Pa and the heater is switched on. The heater with the shaping unit is heated to the temperature of 1,350° C. and annealing is conducted for 30 minutes. Then the chamber is filled with argon to the pressure of $9.91 \times 10^4$ Pa. Thereafter the shaping unit and the crucible are heated to the temperature of 2,000° C. by increasing the power of the heater and both are kept at this temperature for 15 minutes. The power Po of the heater in so doing was 28.5 kW. Then the heater power is stepwise increased by 150 W with residence of 5 minutes at each step, while visually controlling the state of the control particle. At the heater power P equal to 29.1 kW the control particle got molten.

Melting of the starting stock is effected at the heater power of 30.26 kW which is 1.04 P. Fusing of the seed is effected at the heater power of 29.97 kW or 1.03 P.

Building-up of the single crystal is carried out at the heater power of 29.6 kW, which constitutes 1.02 P while moving the seed at the speed of 0.5 mm/min.

Pulling of the single crystal is effected at the speed of the seed movement of 5 mm/min. The heater power is varied within the range of from 29.68 to 34.92 kW which is equal to (1.02–1.2)P. The grown single crystal of 800 mm length is cut-off from the melt. Thereafter, by smoothly decreasing the power of the heater, the single crystal is cooled to the temperature of 1,550° C. at the rate of 30° C./min. Then the heater is switched-off.

The grown single crystals are cut into lengths of 100 mm and tests are carried out in a conventional manner: single crystals are subjected to measurements of their geometrical dimensions with the accuracy of ±0.1 mm, as well as determination of the integral light transmission, electrical breakdown resistance, crystallographic disorientation of single crystal blocks, the mechanical strength of the single crystal.

The yield of suitable single crystals is 86%.

EXAMPLE 2

The procedure of growing shaped single crystals of the foregoing Example 1 is repeated, except that the size of the control particle of the starting stock is equal to $0.5 \times 0.8 \times 0.5$ mm$^3$. The annealing temperature is 1,300° C. The inert gas pressure is $10.30 \times 10^4$ Pa. Melting of the starting stock is effected at the heater power of 31.14 kW or 1.07 P; melting of the seed—at the heater power of 30.95 kW or 1.08 P, building-up of the single crystal at the power of 30.41 kW or 1.08 P. Pulling of the single crystal 3 is conducted at the speed of 3.0 mm/min while varying the power of the heater within the range of from 31.41 to 33.46 kW, which constitutes (1.08–1.22)P. The single crystal is cooled to the temperature of 1,574° C. at the rate of 25° C./min. The yield of suitable single crystals is equal to 86.5%.

EXAMPLE 3

The procedure of Example 1 hereinbefore is repeated, except that the control particle of the starting stock has the size of $0.6 \times 0.6 \times 0.7$ mm$^3$. The annealing is conducted at the temperature of 1,500° C. The pressure of argon in the chamber is $10.79 \times 10^4$ Pa. Melting of the starting stock is effected at the power of the heater of 32.01 kW, fusing of the seed—at the power of 31.43 kW, building-up of the single crystal—at the power of 31.43 kW. Pulling of the single crystal is carried out at the power ranging from 31.43 to 35.55 kW at the speed of 2.0 mm/min. The resulting single crystals are cooled to the temperature of 1,600° C. at the rate of 20° C./min. Then the heater is switched-off. The yield of suitable crystals is equal to 88.5%.

EXAMPLE 4

A lot of 10 tubes is manufactured from leucosapphire. The outside diameter of each tube is equal to 20 mm, the inside diameter—18 mm, length—800 mm. A shaping unit is used with the outside diameter of its upper end face of 20.2 mm, the inside diameter—17.9 mm, height—50 mm, width of the capillary—0.3 mm, average diameter of the capillary—19.1 mm.

The control particle has the size of $0.9 \times 0.9 \times 0.7$ mm$^3$. The annealing is conducted at the temperature of 1,400° C. for 30 minutes. The pressure of the inert gas in the chamber is $9.81 \times 10^4$ Pa. Then the procedure is repeated as described in Example 1 hereinbefore, except that upon melting of the control particle of the starting stock the heater power P is equal to 29.8 kW. Melting of the starting stock is conducted at the heater power of 31.89 kW, fusing of the seed—at the power of 31.29 kW, building-up of the single crystal—at the heater power of 31.43 kW. Pulling of the single crystal is carried out at the speed of 2.0 mm/min at the heater power ranging from 31.58 to 34.57 kW. The single crystal is cooled at the rate of 20° C./min to the temperature of 1,600° C., whereafter the heater is switched off. The yield of suitable crystals is equal to 75%.

EXAMPLE 5

A lot of 10 leucosapphire rod-shaped single crystals with the diameter of 12 mm is made. The diameter of the upper end face of the shaping unit is equal to 12.3 mm, a capillary orifice of 2.0 mm diameter is provided along the axis of the shaping unit. The process is carried out as described in Example 1, except that the size of the control particle of the starting stock is equal to $4 \times 4 \times 4$ mm$^3$. The annealing temperature is 1,400° C., the inert gas pressure $10.3 \times 10^4$ Pa. The heater power P upon melting of the control particle is 30.5 kW. Melting of the starting stock is carried out at the heater power of 33.55 kW, fusing of the seed—at 32.94 kW, building-up of the single crystal—at 32.94 kW. Pulling of the single crystal is carried out at the speed of 1 mm/min at the heater power ranging from 32.94 to 37.21 kW. The resulting single crystals are cooled to the temperature of 1,550° C. at the rate of 20° C./min. The yield of suitable single crystals is equal to 78%.

EXAMPLE 6

A lot of 10 ruby tube-shaped single crystals in manufactured, with the outside diameter of 10 mm and the inside diameter of 8 mm. The shaping unit has the upper end face with the outside diameter of 10.2 mm, inside diameter of 7.9 mm and width of the annular capillary of 0.3 mm its mean diameter of 9.0 mm.

The process is carried out as described in Example 1, except that as the starting stock use is made of ruby lumps (alumina added with chromium oxide of from 0.5 to 3%) and a control particle of the starting stock has the size of $0.9 \times 0.6 \times 0.6$ mm$^3$. The annealing is conducted at the temperature of 1.350° C. The inert gas pressure in the chamber is $9.81 \times 10^4$ Pa. The shaping unit and crucible are heated to the temperature of 2,030° C. The heater power P upon melting of the control particle of the starting stock is equal to 30.2 kW. Melting of the starting stock is effected at the heater power of 31.41 kW, fusing of the seed—at 31.11 kW, building-up of the single crystal—at 30.80 kW. Pulling of the single crystal is carried out at the speed of 1.5 mm/min at the heater power varied within the range of from 30.80 to 33.22 kW. The obtained single crystals are cooled to the temperature of 1,550° C. at the rate of 30° C./min. The yield of suitable single crystals is equal to 81%.

EXAMPLE 7

A lot of 10 rod-shaped ruby single crystals made, of 3 mm diameter. The diameter of the upper end face of the shaping unit is equal to 3.1 mm, the capillary orifice diameter is 1.5 mm. The process is conducted in a manner similar to that described in Example 1 hereinbefore, except that a control particle of the starting stock is of $4 \times 4 \times 4$ mm$^3$ size. The annealing is conducted at the temperature of 1,450° C. The inert gas pressure is $10.79 \times 10^4$ Pa. The crucible and shaping unit are heated to the temperature of 2,030° C. The heater power P upon melting of the control particle of the starting stock is 30.3 kW. Melting of the starting stock is conducted at the heater power of 33.33 kW, fusing of the seed—at the power of 32.42 kW, building-up of the single crystal—at 32.72 kW. Pulling of single crystals is conducted at the speed of 1.0 mm/min at the heater power ranging from 32.72 to 33.96 kW. The resulting single crystals are cooled at the rate of 20° C. to the temperature of 1,600° C. The yield of suitable single crystals is equal to 79%.

EXAMPLE 8

A lot of 10 tube-shaped single crystals of aluminiumyttrium garnet (with the melting point of 1,900° C.) are made, with the outside diameter of 10 mm and inside diameter of 8 mm. The upper end face of the shaping unit has the outside diameter of 10.3 mm, inside diameter—7.9 mm, the annular capillary has its mean diameter of 9.1 mm, width—0.25 mm.

The process for growing single crystals is carried out as described in Example 1, except that as the starting stock lumps of aluminium-yttrium garnet ($Y_3Al_5C_{12}$) are used and the control particle of the starting stock has the size of $0.5 \times 0.5 \times 0.7$ mm$^3$. The annealing temperature is 1,300° C., the inert gas pressure—$9.91 \times 10^4$ Pa. The crucible and shaping unit are heated to the temperature of 1,900° C. The heater power P upon melting of the control particle is 27.5 kW. Melting of the starting stock is carried out at the heater power of 30.25 kW, fusing of the seed—at 29.7 kW, building-up of the single crystal—at 29.7 kW. Pulling of the single crystal is effected at the speed of 2.0 mm/min at the heater power ranging from 29.7 to 33.55 kW. The resulting single crystals are cooled to the temperature of 1,550° C. at the rate of 30° C./min. The yield of suitable single crystals is 72%.

EXAMPLE 9

A lot of 10 aluminium-yttrium garnet single crystals are made, having the shape of rods of 5 mm diameter. The diameter of the upper end face of the shaping unit is 5.1 mm, the diameter of the axial capillary orifice is 1.5 mm.

The process for growing single crystals is performed in much the same manner as described in Example 1, except that the control particle has the size of $3 \times 3 \times 3$ mm$^3$. The annealing temperature is 1,450° C., the inert gas pressure is $69 \times 10^4$ Pa. The crucible and shaping unit are heated to the temperature of 1,900° C. The heater power P upon melting of the control particle is 28.1 kW. Melting of the starting stock is effected at 29.22 kW, fusing of the seed—at 28.94 kW, building-up of the single crystal—at 28.67 kW. Pulling of the single crystal is carried out at the speed of 1.5 mm/min at the heater power ranging from 28.67 to 31.32 kW. The resulting single crystals are cooled to the temperature of 1,600° C. at the rate of 20° C./min. The yield of acceptable single crystals is equal to 65%.

EXAMPLE 10

A lot of 10 scandium oxide ($Sc_2O_3$) (m.p. 2,485° C.) single crystals are made, having the shape of rods of 4 mm in diameter. The diameter of the upper end face of the shaping unit is 4.1 mm, the diameter of the axial capillary orifice is 1.5 mm. The process for growing of single crystals is performed in much the same manner as described in Example 1, except that the control particle has the size of $3 \times 3 \times 3$ mm$^3$. The annealing temperature is 1,500° C., the inert gas pressure is $9.81 \cdot 10^4$ Pa. The crucible and shaping unit are heated to the temperature of 2,440° C. The heater power P upon melting of the control particle is 35.1 kW. Melting of the starting stock is effected at 88.61 kW, fusing of the seed—at 37.91 kW, building-up of the single crystal—at 37.56 kW. Pulling of the single crystal is carried out at the speed of 2.5 mm/min at the heater power ranging from 37.56 to 42.12 kW. The resulting single crystals are cooled to the temperature of 1,550° C. at the rate of 20° C./min. The yield of acceptable single crystals is 77%.

INDUSTRIAL APPLICABILITY

The process for growing shaped single crystals according to the present invention is used for the production of single crystals of a predetermined shape, of various refractory optically transparent compounds of metals, mainly leucosapphire, requiring substantially no machining, which are widely employed in the instrument-making, chemistry, metallurgy, and other industries as components of chemical equipment, optical instruments, fittings of oil wells, containers for the synthesis and analysis of extra-pure alloys, as well as in other similar devices and also as blanks for articles of jewelry.

We claim:

1. A process for growing shaped single crystals of refractory optically transparent metal compounds, comprising the steps of:

(1) melting a starting stock of said refractory metal compound in an inert gas atmosphere under the effect of heat evolved by a heater;
    (2) fusing a seed in a zone of crystallization;
    (3) building-up a single crystal and pulling thereof from the zone of crystallization to a required length while continuously feeding a melt into the zone of crystallization through a capillary system of a shaping unit; and
    (4) varying the power of the heater after which the single crystal is cut-off from the melt and cooled, wherein prior to melting of the starting stock, a control particle of said starting stock is placed in the zone of crystallization, the power P of the heater is noted at the moment of fusing of said control particle, and melting of the starting stock is then effected at a heater power of $(1.04-1.1)P$, fusing of the seed is carried out at a power of the heater of $(1.03-1.08)P$, building-up of the single crystal at a power of $(1.02-1.08)P$, pulling of the single crystal from the crystallization zone at a power of $(1.02-1.22)P$ and cooling of the single crystal is conducted at a rate of 20°–30° C./min. by lowering power of the heater, and upon reaching the single crystal temperature of 1,600°–1,550° C., the heater is switched-off.

2. The process of claim 1, wherein said single crystal is leucosapphire.

3. The process of claim 1, wherein said single crystal is ruby.

4. The process of claim 1, wherein said single crystal is aluminum-yttrium garnet.

5. The process of claim 1, wherein said single crystal is scandium oxide.

* * * * *